US007254763B2

(12) United States Patent
Aadsen et al.

(10) Patent No.: US 7,254,763 B2
(45) Date of Patent: Aug. 7, 2007

(54) BUILT-IN SELF TEST FOR MEMORY ARRAYS USING ERROR CORRECTION CODING

(75) Inventors: Duane Rodney Aadsen, Bath, PA (US); Ilyoung I. Kim, Franklin Park, NJ (US); Ross Alan Kohler, Allentown, PA (US); Richard Joseph McPartland, Nazareth, PA (US)

(73) Assignee: Agere Systems Inc., Allentown, PA (US)

( * ) Notice: Subject to any disclaimer, the term of this patent is extended or adjusted under 35 U.S.C. 154(b) by 191 days.

(21) Appl. No.: 10/931,709

(22) Filed: Sep. 1, 2004

(65) Prior Publication Data

US 2006/0048031 A1    Mar. 2, 2006

(51) Int. Cl.
*G01R 31/28* (2006.01)
(52) U.S. Cl. ..................................... 714/733
(58) Field of Classification Search ............... 714/718, 714/733
See application file for complete search history.

(56) References Cited

U.S. PATENT DOCUMENTS 4,001,818 A * 1/1977 Radichel et al. ............ 340/520
5,841,785 A * 11/1998 Suzuki ........................ 714/718
5,896,398 A * 4/1999 Sekine ........................ 714/720
6,550,023 B1 * 4/2003 Brauch et al. ................ 714/42
6,738,938 B2 * 5/2004 Nadeau-Dostie et al. ... 714/719
7,134,063 B2 * 11/2006 Cho et al. .................... 714/733
2004/0107396 A1 * 6/2004 Barone et al. .............. 714/733
2004/0205427 A1 * 10/2004 Ichikawa .................... 714/710
2006/0041799 A1 * 2/2006 Sato ............................ 714/718

* cited by examiner

Primary Examiner—James C. Kerveros

(57) ABSTRACT

A memory self-testing system, apparatus, and method are provided which allow for testing for a plurality of bit errors and passing memory arrays having an error level which is correctable using selected error correction coding. An exemplary system embodiment includes a memory array, a comparator, an integrator, and a test control circuit. The memory array is adapted to store input test data and output stored test data during a plurality of memory read and write test operations. The comparator compares the input test data and the stored test data for a plurality of bit positions, and provides a corresponding error signal when the stored test data is not identical to the input test data for each bit position of the plurality of bit positions. The integrator receives the corresponding error signal and maintains the corresponding error signal for each bit position during the plurality of test operations. The test control circuit provides a fail signal when a predetermined level of corresponding error signals have been provided for the plurality of bit positions.

34 Claims, 4 Drawing Sheets

BUILT-IN SELF TEST FOR MEMORY ARRAYS USING ERROR CORRECTION CODING

FIELD OF THE INVENTION

The present invention relates, in general, to integrated circuits having data storage capability and, in particular, to memory architectures having built-in self test capability which provide for detecting predetermined error levels which are correctable using error correction coding.

BACKGROUND OF THE INVENTION

A semiconductor data storage device, such as a random access memory ("RAM"), static random access memory ("SRAM"), dynamic random access memory ("DRAM"), synchronous dynamic random access memory ("SDRAM"), magnetic random access memories ("MRAMs"), electronically erasable programmable read-only memory (EEPROM), and other forms of a memory, are designed to store data in a memory array of memory "cells". Each memory cell, consisting of one or more transistors per bit of storage, is programmed during a write operation and is capable of maintaining the stored data, with or without memory refresh cycles, depending upon the type of memory. The memories may be included in any type of integrated circuit ("IC"), such as an IC that substantially contains only a memory array, as a dedicated memory IC, or included as an "embedded" memory as part of an IC containing additional, other circuits, such as embedded RAM, DRAM, SDRAM, etc., with a processor, digital signal processor, controller, wireless telecommunication IC or other communication IC.

A memory array is defined by a number of transistors, forming memory cells, generally arranged in a grid pattern having a plurality (or series) of rows and columns. Rows are typically utilized to select one or more data words, with the columns providing the input (for a memory write operation) and output (for a memory read operation) for each bit of each such word.

Memory arrays are tested in a wide variety of ways. External probe tests typically provide for continuity testing, and for testing of some AC and DC parameters. Many of these tests utilize one or more test patterns, in which test data is stored in the memory, read from the memory and then compared with the original test data. Typical patterns, for example, are all 1's, all 0's, checkerboard, stripe, marching, galloping, sliding diagonal, waling, and ping-pong, and test time varies with the selected pattern. Different patterns are also operative to detect different faults and failure modes during testing, such as "stuck at" faults, pattern sensitivity (such as interference and bit-line imbalance faults), multiple writing, refresh sensitivity, open and short circuits, leakage current faults, sense amplifier recovery, access time, voltage bump failures, decoder failures, and other faults and defects.

Self-testing, rather than external probe testing, has also been incorporated into many memory ICs, through the addition of additional test circuitry within the IC. Prior art built-in self-testing, however, typically determines whether there are no faults, thereby "passing " the memory as acceptable, or determining that there is at least one fault, and thereby "failing" the memory as unacceptable. Such prior art self-testing does not differentiate between memory ICs which have a single memory defect, such as a defect affecting a single bit, and multiple memory defects (affecting at least two bits), such as a defect affecting a plurality of bits.

A representative, prior art memory self-testing circuit 10 is illustrated in FIG. 1. Input test data is compared, bit position by bit position (i.e., by corresponding column), with the stored test data from the memory 20 under test, in comparator 50. In the event that the stored data does not match the test data at a given bit position, an output indicating such a failure (such as a logic 1 or high voltage state) is provided on one of the corresponding comparator output lines 55. Prior art memory self-testing circuits (such as 10) are incapable of differentiating multiple bit errors from a single bit error (such as one error versus multiple errors) because, following comparison of test data with stored data, any indicator of failure for a bit position is typically "OR'd" (OR gate 60) with the indicators of all other bit positions. If any one bit position has a failure, the output of the OR gate 60 will indicate a failure. The outcome from the OR gate 60 is then latched (with feedback) (latch 65), so that once a failure has occurred, it will not be overwritten, and the failure indicator 70 will indicate a memory failure. As a consequence of the OR process, the self-testing circuit provides information that at least one error has occurred, but cannot determine that more than one error may have occurred.

Other types of memory testing are also utilized in the prior art, such as testing which may be used with memory ICs having redundant or "spare" portions of the memory array. In such testing, memory ICs having no errors may be fully passed, and memory ICs having one or more bit errors may be "conditionally passed", in a first tier of testing. Those memory ICs which have been conditionally passed may then be physically repaired by disabling one or more rows or columns having defects, and substituting new rows or columns from the additional, redundant hardware available in the memory IC, potentially followed by additional testing. This testing requires tracking of any defect of every cell of the array. Moreover, the ability to utilize or repair such conditionally passed ICs is not assured by a definitive count or other test control criteria. More particularly, memory ICs having up to a predetermined level of bit errors cannot be fully and automatically passed, as those memories may or may not be repairable in fact. In addition, such testing requires the availability of spare or redundant parts of a memory IC, increasing memory size requirements without increasing the actual available memory. Such testing may also require several levels of testing, the initial conditional testing, followed by repair and potentially additional testing.

These current self-testing modes also do not utilize and take advantage of error correcting capabilities which may be available in the coding process for the data to be stored in the memory. Such error correcting capabilities are typically utilized to correct for "soft" errors, such as memory read errors which may occur due to external interference, such as from cosmic rays, other forms of background radiation, or other noise sources. As a consequence, by only detecting that there is at least one bit error, prior art memory self-testing fails memory ICs having a single defect, even though the single bit error could be corrected through error correction codes. By not differentiating between levels or amounts of potential defects, the prior art memory self-testing results in discarding memory ICs which are, in fact, capable of being utilized within IC error specifications. Such prior art memory self-testing, therefore, decreases the available IC yield from IC manufacturing.

As a consequence, a need remains to provide a built-in self-testing circuit for a memory array which can differentiate between levels or amounts of potential defects. Such a built in memory self-testing circuit should provide for detecting bit errors, and for differentiating memory ICs having bit errors which are correctable within the capability of a selected error correction code from memory ICs having bit errors which are not correctable or which otherwise exceed the capability of the selected error correction code. Such a built in memory self-testing circuit should not require additional, redundant memory, should not require defect tracking by specific memory cell, and should provide a definitive rather than conditional test result.

SUMMARY OF THE INVENTION

The present invention provides an apparatus, system and method for testing memory arrays. The various embodiments of the present invention provide built-in self-testing ("BIST") for a memory array which can differentiate between levels or amounts of defects or other faults, so that those memory ICs having bit errors which are correctable within the capability of a selected error correction code are differentiated from those memory ICs having bit errors which are not correctable or which otherwise exceed the capability of the selected error correction code. The various embodiments of the present invention allow for an increased and improved IC manufacturing yield, as memory ICs having correctable bit errors are not required to be discarded as failed ICs. In addition, the various embodiments of the present invention provide for a reduced test time using less complicated testing patterns, while simultaneously providing complete fault detection coverage.

Exemplary embodiments of the invention provide a memory self-test apparatus, in which the memory is adapted to store input test data and output stored test data during a plurality of memory read and write test operations. The apparatus and system include a comparator, an integrator, and a test control circuit. The comparator is adapted to compare the input test data and the stored test data for a plurality of bit positions, and to provide a corresponding error signal when the stored test data is not identical to the input test data for each bit position of the plurality of bit positions. The integrator is coupled to the comparator to receive the corresponding error signal, and the integrator adapted to maintain the corresponding error signal for each bit position during the plurality of test operations. The test control circuit is coupled to the integrator, the test control circuit adapted to provide a fail signal when a predetermined level of corresponding error signals have been provided for the plurality of bit positions.

An exemplary method of testing a memory array in accordance with the invention is also provided. The method comprises comparing the input test data and the stored test data for a plurality of bit positions; providing a corresponding error signal when the stored test data is not identical to the input test data for each bit position of the plurality of bit positions; maintaining the corresponding error signal for each bit position during the plurality of test operations; and providing a fail signal when a predetermined level of corresponding error signals have been provided for the plurality of bit positions.

Another exemplary system in accordance with the invention comprises a memory array, a test data generator, a comparator, an integrator, and a test control circuit. The memory array is adapted to store input test data and output stored test data during a plurality of memory read and write test operations. The test data generator is adapted to generate, as input test data, a plurality of test patterns corresponding to the plurality of test operations, with each test pattern of the plurality of test patterns adapted to detect single-bit errors. The comparator is adapted to compare the input test data and the stored test data for a plurality of bit positions, and to provide a corresponding error signal when the stored test data is not identical to the input test data for each bit position of the plurality of bit positions, wherein the plurality of bit positions correspond to one or more data words, with each data word having a plurality of data bits and a plurality of error correction bits. The integrator is adapted to maintain the corresponding error signal for each bit position during the plurality of test operations. The test control circuit is adapted to provide a fail signal when a predetermined level of corresponding error signals have been provided for the plurality of bit positions, with the predetermined level of corresponding error signals corresponding to an error correction capability of a selected error correction code.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various diagrams, in which.

DETAILED DESCRIPTION OF THE EXEMPLARY EMBODIMENTS

Figure 1:
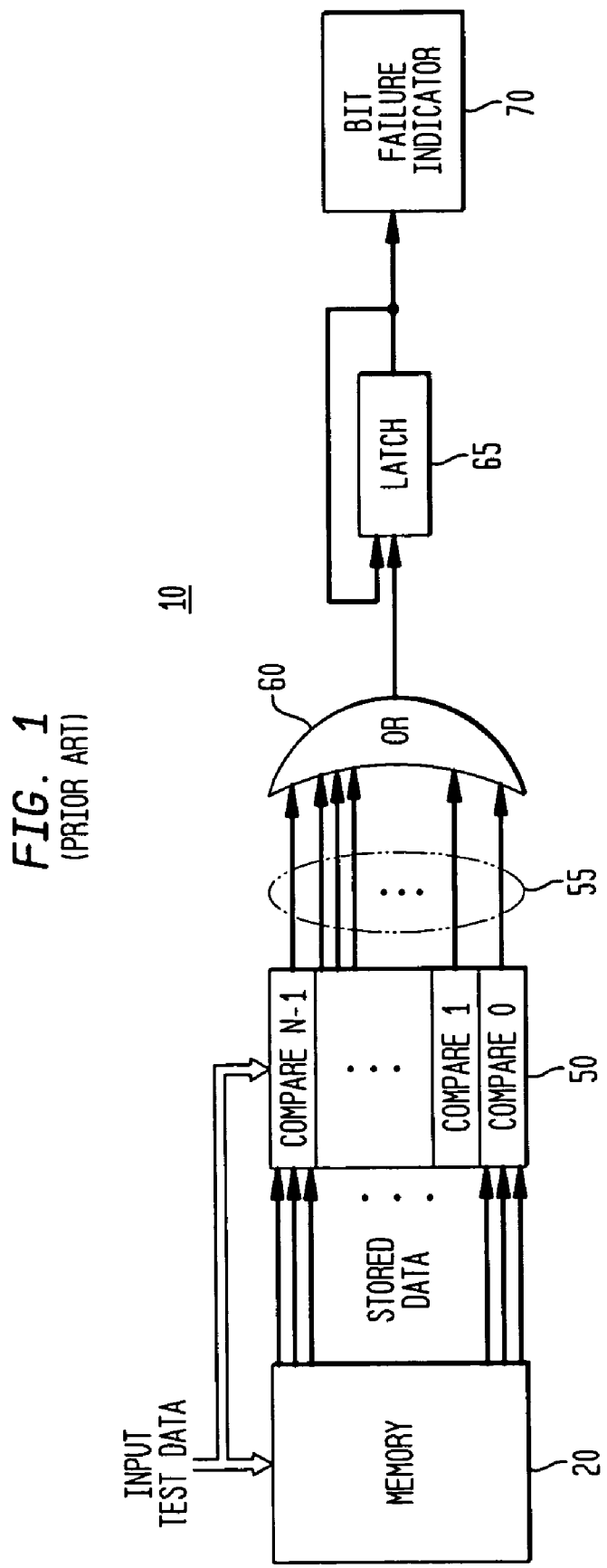
FIG. 1 (or FIG. 1) is a circuit diagram of a prior art memory self-test circuit.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As mentioned above, the various embodiments of the present invention provide built-in self-testing ("BIST") for a memory array which can differentiate between levels or amounts of defects or other faults. The various embodiments of the built in memory self-testing of the present invention provide for detecting bit errors, and for differentiating those memory ICs having bit errors which are correctable within the capability of a selected error correction code from those memory ICs having bit errors which are not correctable or which otherwise exceed the capability of the selected error correction code. As a consequence, utilization of the various embodiments of the present invention allow for an increased and improved IC manufacturing yield, as memory ICs having correctable bit errors are not required to be discarded as failed ICs. In addition, the various embodiments of the present invention provide for a reduced test time using less complicated testing patterns, while simultaneously providing complete fault detection coverage.

Figure 2:
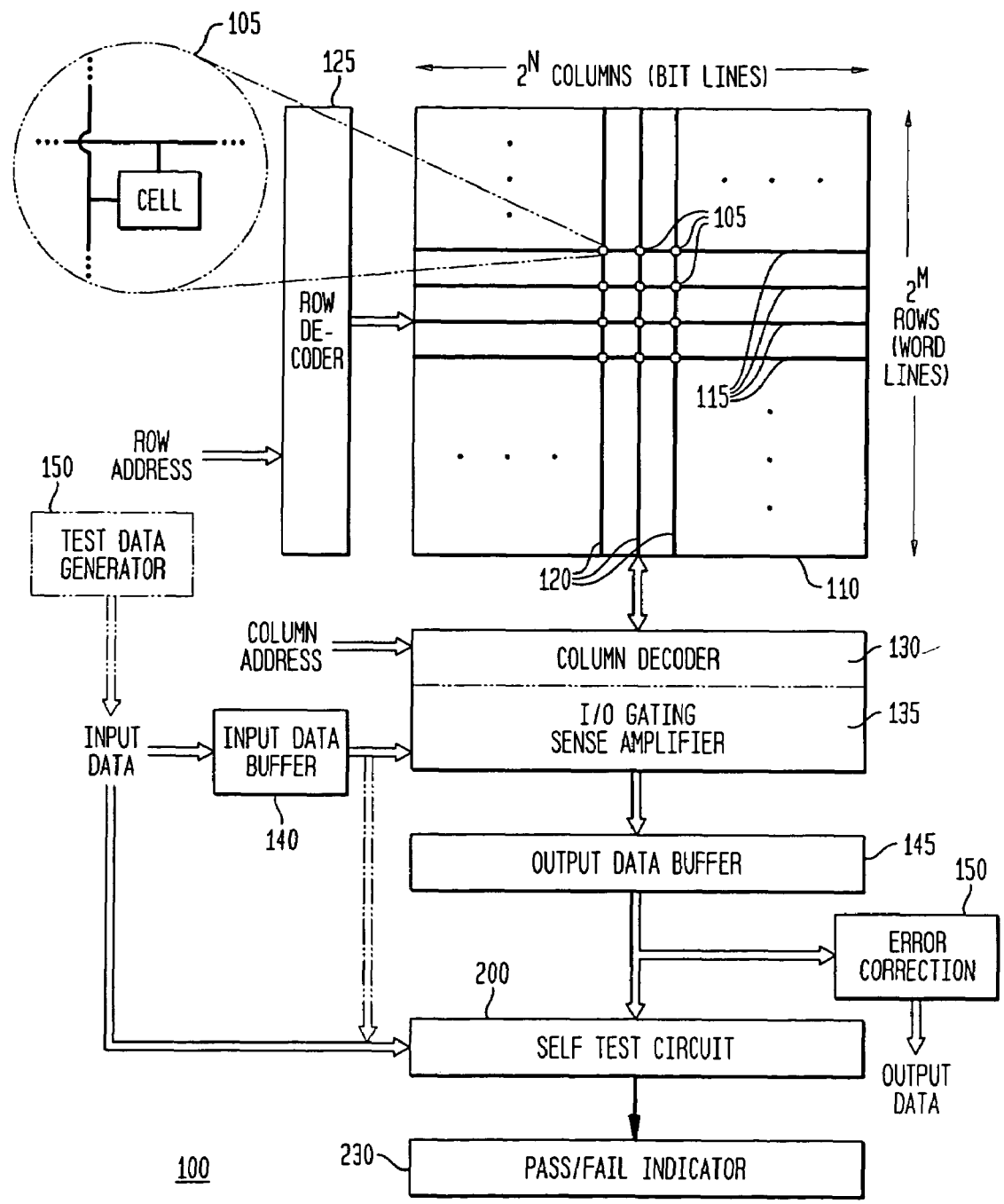
FIG. 2 (or FIG. 2) is a block diagram of an exemplary memory system having built-in self test in accordance with the teachings of the invention.

FIG. 2 (or FIG. 2) is a block diagram of an exemplary memory system 100 having built-in self test in accordance with the teachings of the invention. Referring to FIG. 2, the system 100 includes a memory array 110 having a plurality of cells 105, with each cell 105 coupled to a corresponding row 115 (for data word selection) and column 120 (bit line). The system 100 may utilize any type of memory array 100, such as RAM, SRAM, SDRAM, DRAM, MRAM, EEPROM, etc., and may be included within any type of IC, such as a memory IC or embedded memory with other circuitry.

Each cell 105 is generally activated for writing to or reading from the memory array 110 by selection of its corresponding row 115, with information (one or more bits) provided on the cell's one or more corresponding columns 120 as either input data (for writing to memory array 110) or output data (for reading from memory array 110). A row 115 is selected by provision of a row address to the row decoder 125, and such row 115 selection generally includes one or more data words with corresponding error correction bits, depending upon the size of the memory array 110. For example, in an exemplary embodiment, selection of a data word will generally include selection of 32 data bits and 6 error correction code ("ECC") bits, and a given row 115 generally includes a plurality of data words.

As the columns 120 corresponding to the bits of a plurality of data words are generally spaced apart (interspersed or interleaved) throughout the memory array 110, selection of a particular data word (from a plurality of data words) from an activated row 115 is accomplished by selection of particular columns (bit lines) 120, by provision of a column address to a column decoder 130 (illustrated in conjunction with a sense amplifier and input/output gating 135). Data to be stored in a selected row 115 and selected columns 120 (memory write) is provided, generally, through an input data buffer 140, such as input test data from test data generator 150. Such a test data generator 150 may be included within the IC having the system 100, or may be off-chip. Stored data (such as stored test data) to be provided from a selected row 115 and selected columns 120 (memory read) is output through the sense amplifier (of 135) to the output data buffer 145. In the exemplary embodiments, any error correction (150) is applied to stored and read data after BIST testing (or independently of BIST testing, i.e., in subsequent, actual non-testing operation of the memory array 110 and system 100), in order to allow direct testing of the ECC bit positions of the memory array 110. It will be apparent to those of skill in the art that numerous other equivalent variations are available and are within the scope of the present invention.

Input test data from the test data generator 150 is stored in the memory array 110 and, following a memory read operation, is provided as output or stored test data to the self-test circuit 200 of the present invention. The same input test data from the test data generator 150 is also provided directly to the self-test circuit 200, either directly from the test data generator 150 or from the input data buffer 140. Following completion of testing, as discussed in greater detail below, a pass or fail signal is provided from the self-test circuit 200 to the pass/fail indicator 230, to indicate whether the system 100 is acceptable or unacceptable.

Figure 3:
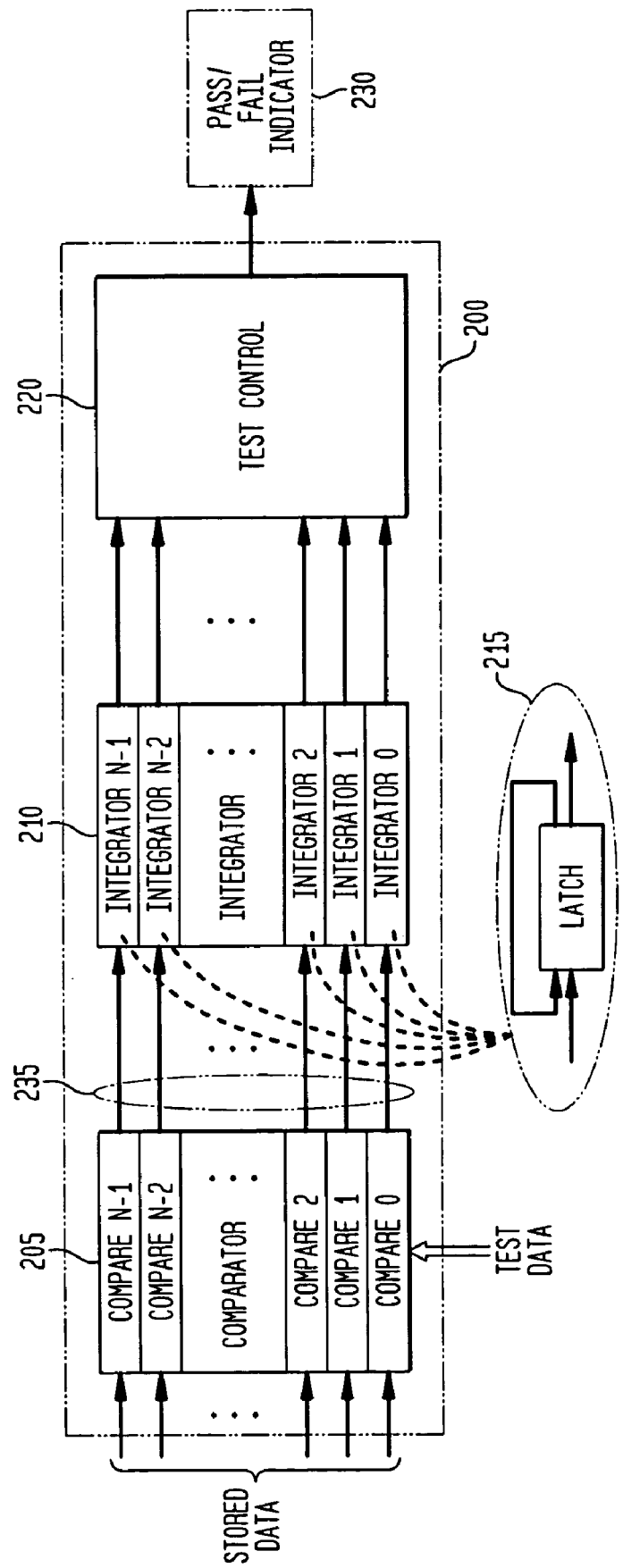
FIG. 3 (or FIG. 3) is a block diagram of an exemplary memory built-in self test circuit in accordance with the teachings of the invention.

FIG. 3 (or FIG. 3) is a block diagram of an exemplary memory built-in self test circuit 200 in accordance with the teachings of the invention. The stored (or output) test data read from the memory array 110 and provided to the self-test circuit 200 is compared, bit position by bit position, with the input test data (provided directly to the self-test circuit 200), by comparator 205, for all test data stored in the memory array 110 (i.e., row by row (all data words) and column by column (all bit positions)). As illustrated, comparator 205 compares input test data with stored test data for "N" bit positions, illustrated as bit positions 0 (zero) through N-1. Depending on the selected embodiment, N may correspond to the number of columns of the array or the number of bits in a data word, for example.

The input test data and stored test data are compared, for each bit position, and if they do not match (are not identical), a bit error has occurred and is reflected in the state of the bit (e.g., logic 1 or logic 0) output on the corresponding output line 235 of comparator 205. The existence of any error (discrepancy) is maintained, separately for each bit position (which corresponds to a column 120 of the memory array 110), by integrator 210. Using integrator 210, once an error has occurred for a given bit position as determined by comparator 205, that error information is maintained, even if other bits from other previous or subsequent data words are correct. In an exemplary embodiment, the integrator 210 is implemented using a plurality of latch circuits 215, with each bit position having a separate latch 215, and with each latch having internal feedback (as illustrated) to maintain any error information through repeated testing cycles. For example, if an error has occurred at a given bit position, the comparator 205 may output a logic 1 (e.g., high voltage) to the corresponding integrator 210 bit position; through internal feedback, that logic 1 will continue to be stored in a latch 215, as a bit fail (BF) flag or signal. More particularly, once a bit fail flag is set, it is never overwritten (and unset) as passing for the remainder of the testing. As a consequence, the existence of any error is maintained for all data words of all testing cycles and all testing patterns, individually for each bit position, preserving knowledge of bit position failure (instead of prematurely OR'ing the comparison results to generate a single bit fail flag for the entire memory array 110). This preservation of information, for each bit position, provides the capability for the more sophisticated testing of the present invention. The integrator 210 may be implemented equivalently with a variety of circuits, such as an accumulator, adder, register, etc.

As testing is occurring, error information may be provided from the integrator 210 to the test control circuit 220 on a continuous basis, or following completion of testing. Generally, when error information is provided on a continuous basis, if there are a sufficient number of errors across the bit positions, the memory array 110 may be failed prior to test completion. Passing the memory array 110, however, should only occur following completion of all testing, i.e., when all test patterns have been stored, compared, and test results accumulated.

In exemplary embodiments, test control circuit 220 is implemented using combinatorial or conditional logic with an acceptable (or unacceptable) error level based upon the correction capability of the selected error correction coding utilized in the memory array 110. For example, in an exemplary embodiment, either no errors or at most one error in one bit position are allowable, as within the correction capability of applicable error correction coding, such that the memory array 110 is failed if there are errors in two or more bit positions. For this example, assuming the integrator 210 is initially set to zero and an error is indicated by a logic 1, the test control circuit 220 may be implemented by circuitry which performs the following combinatorial and conditional functions using a CASE statement:

| CASE(BF) | |
|---|---|
| | 1000....000 = Pass |
| | 0100....000 = Pass |
| | 0010....000 = Pass |
| | ... |
| through | 0000....010 = Pass |
| | 0000....001 = Pass |
| | 0000....000 = Pass |
| | ELSE = Fail. |

Equivalent implementations of test control circuit 220 may be made using HDL or VERILOG, or by changing the state of the bit fail flag (e.g., a pass being designated by a 1, and a fail by a 0). As may be seen from the above example, each bit position is examined for any error that may have occurred from any testing pattern. A memory array 110 is allowed to pass if there are one or no errors for all bit positions, and otherwise failed, with such pass or fail information provided to a pass/fail indicator 230, such as setting a built-in self test (BIST) Pass flag or signal.

This invention may be implemented in a variety of ways, such as based on an allowable number of bit errors per data word, or an allowable number of bit errors per a plurality of data words, or an allowable number of bit errors per entire memory array 110. In the exemplary embodiment, as a memory array 110 generally provides the capacity for a plurality of data words per row 115, and by allowing at most one bit error per data word, it is conceivable that the fine-grained testing of the present invention will allow a memory array 110 to pass having a plurality of bit errors which are, nonetheless, correctable as within the error correcting capability of the selected error correction code. As a consequence, manufacturing yield is generally increased as a result of application of the present invention.

It will be apparent to those of skill in the art that other conditional logic may be implemented based on the correction capability of the selected error correction code, e.g., 2 or more errors may be allowed, 3 or more errors may be allowed, and so on. In addition, while more errors may be allowable, there may be other limitations which constrain the allowable number of errors, such as test control circuit 220 complexity, IC specifications, etc. Numerous other implementations of test control circuit 220 will also be apparent to those of skill in the art, with all such implementations considered equivalent and within the scope of the present invention.

In addition, while the self test circuit 200 is illustrated in FIG. 3 as discrete logic or circuit blocks, it should be understood that the self test circuit 200 may be embodied or implemented in a wide variety of ways which perform the functionality discussed above. For example, the self test circuit 200 may be implemented as or part of a processor, microprocessor, digital signal processor, controller, field programmable gate array, adaptive computing circuit, and so on (individually and collectively referred to as a "processor"), particularly when included with embedded memory. For example, the methodology of the invention may be embodied as a set of program instructions or configurations executed by a processor having an embedded memory for self-testing of the embedded memory.

Figure 4:
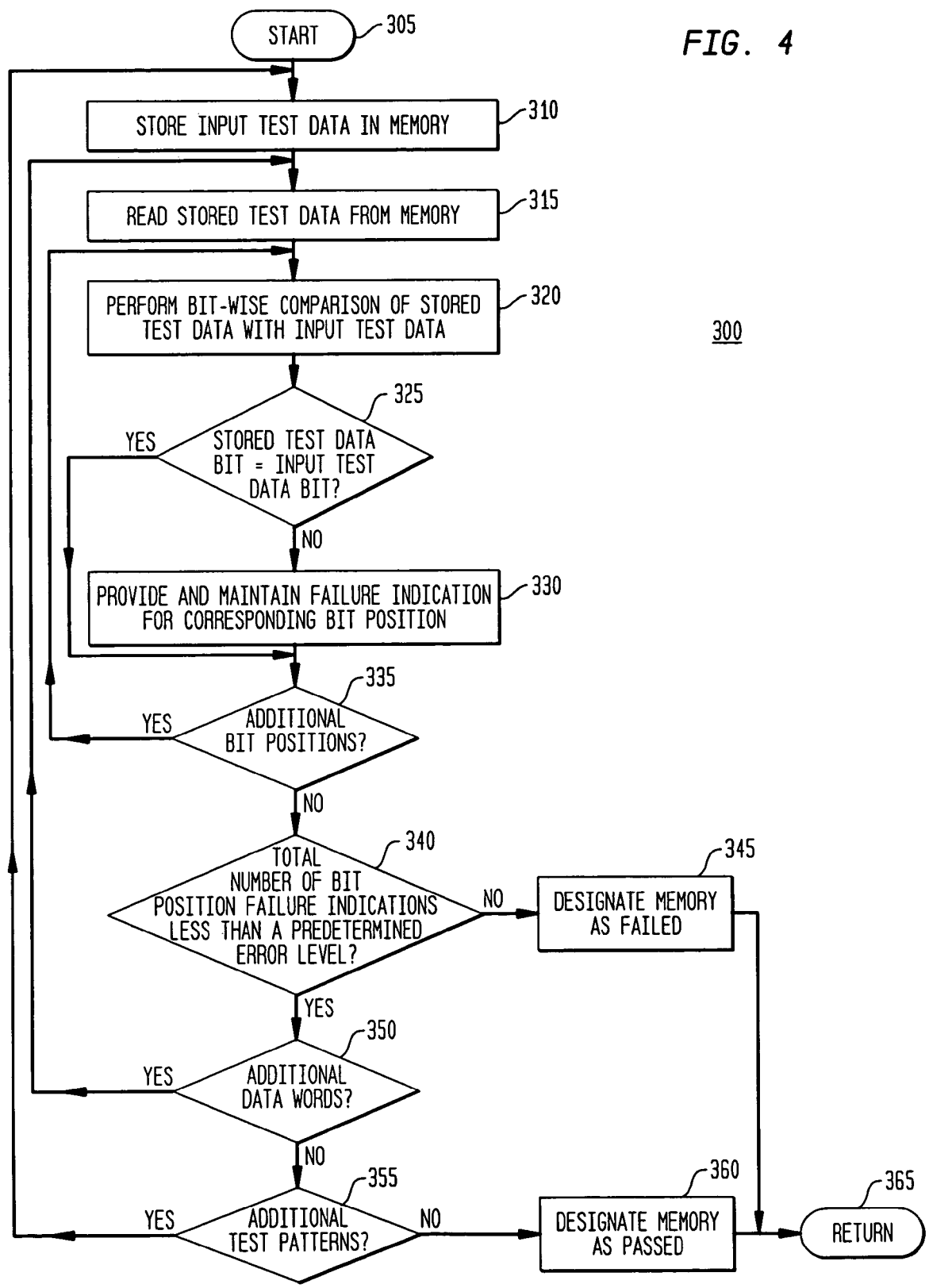
FIG. 4 (or FIG. 4) is a flow diagram of an exemplary method of memory testing in accordance with the teachings of the invention.

FIG. 4 (or FIG. 4) is a flow diagram of an exemplary method 300 of memory testing in accordance with the teachings of the invention, and provides a useful summary. It should be understood that many of the loops illustrated in method 300 may be performed in parallel, such as through implementation of the system 100 and self-test circuit 200.

Beginning with start step 305, the method stores input test data in memory, step 310, and reads stored test data from memory, step 315. The method then performs a bit-wise comparison of the stored test data with the input test data, step 320. When the stored test data bit is not the same as the input test data bit (i.e., a bit error has occurred), step 325, the method provides and maintains an indication of failure for the corresponding bit position, step 330, such as by setting and not overwriting a bit fail flag. Following step 330, or when the stored test data bit is the same as the input test data bit (i.e., a bit error has not occurred) in step 325, the method determines whether there are additional bit positions to be tested, step 335, and if so, returns to step 320 for additional comparisons. (As indicated above, steps 320, 325, 330 and 335 are generally implemented in parallel.) Otherwise, when there are no additional bit positions to be tested, the method determines whether the total number of failures for all bit positions is less than a predetermined error level (as determined by the error correction capability of the ECC or other design specifications), step 340. Step 340 may be implemented by summation or accumulation of bit errors for all bit positions, followed by a comparison to a predetermined level, or, for example, by the combinatorial and conditional logic discussed above. Step 340 may also be implemented equivalently, such as by whether the total number of failures for all bit positions is greater than a predetermined error level.

When the total number of failures for all bit positions is not less than the predetermined error level in step 340, the memory is designated as failed, step 345, and the method may end, return step 365. Alternatively, as mentioned above, the comparison and failure determination steps 340 and 345 may be performed following completion of all testing, following step 355. When the total number of failures for all bit positions is less than the predetermined error level in step 340, the method determines whether there are additional data words (or rows) to be tested, step 350, and if so, the method returns to step 315, to read the additional data words (or rows) from the memory. When there are no additional data words (or rows) to be tested in step 350, the method determines whether there are additional test patterns to be utilized, step 355, and if so, the method returns to step 310, to store test data in the memory. When there are no additional test patterns in step 355, the memory may be designated as passing, step 360, and the testing method may end, return step 365.

There are numerous advantages of the present invention. If current methods were utilized to screen out memories with two or more defective bits per data word, BIST test time would be substantially increased. In order to exhaustively screen out memories with two or more defects per data word, while passing those memories with no more than one defect per data word, considerably greater test pattern complexity would be required. Such test pattern complexity would be required with prior art methods because different bits in a data word may require different conditions to make them fail, such as data polarity and the state or operation of surrounding cells 105, so that to detect a double bit error in a single read cycle can require unique conditions to be forced on different bits simultaneously. To reduce the complexity and length of the BIST test patterns, various assumptions have been made in the prior art, such as the assumption that all defective memory cells are of the "stuck at" type, and therefore do not test for all possible combinations of defects known as "nearest neighbor" effects. This prior art methodology reduces the fault coverage of the BIST test, generating risks for the memory user.

In addition, other prior art methods suffer from no direct read/write access to the storage locations of the ECC bits (e.g., ECC parity bits), making it considerably more difficult to place precise test data patterns in the ECC bit cells to test for nearest neighbor effects. The present invention does not have this limitation, as all bits of the memory array 110 are tested directly, prior to any error correction.

The various embodiments of the present invention also significantly reduce BIST testing time, as fewer bit error testing patterns are required, while nonetheless providing complete error testing. More particularly, bit-pair error patterns (in which bit-pairs are examined to determine simultaneous failure) are not required, because the present invention examines each bit position independently and maintains any failure information on a per-bit basis. Where "N" is the number of bits per data word, and "x" is the testing time for one-bit errors, such bit pair testing requires Nx of testing time. In contrast, the present invention provides this level of testing, but reducing the test time by 1/N, which is a huge test time savings.

In summary, the various embodiments of the invention integrate over time, for individual bit defects, the failure results of BIST test patterns that are able to efficiently detect stuck at faults and nearest neighbor effect faults. Then, for example, by demonstrating that at most one data bit position ever fails for all memory defects in the memory instance, it is known that all failures are then ECC correctable for that corresponding capability of the selected ECC. This avoids the longer testing time or incomplete fault coverage of the multiple bit error detecting "exhaustive pattern" method described previously. The present invention works efficiently, as empirical results have indicated that as many as 90% of defective memories have defects affecting only one data bit position of the memory instance. The soft error correction efficiency of the ECC is negligibly compromised because only a very small percentage of data words per instance of a memory array 110 are observed to have "hard" errors which utilize the ECC correction capability, allowing the ECC to be kept in reserve to correct for "soft" errors.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A self-test apparatus for a memory, the memory adapted to store input test data and output stored test data during a plurality of memory read and write test operations, the apparatus comprising:
   a comparator coupled to receive the input test data and the stored test data, the comparator adapted to compare the input test data and the stored test data for a plurality of bit positions, and to provide a corresponding error signal when the stored test data is not identical to the input test data for each bit position of the plurality of bit positions;
   an integrator coupled to the comparator to receive the corresponding error signal, the integrator adapted to maintain the corresponding error signal for each bit position during the plurality of test operations; and
   a test control circuit coupled to the integrator, the test control circuit adapted to provide a fail signal when a predetermined level of corresponding error signals have been provided for the plurality of bit positions.

2. The memory self-test apparatus of claim 1, wherein the integrator comprises a plurality of latches, each latch of the plurality of latches corresponding to a bit position of the plurality of bit positions.

3. The memory self-test apparatus of claim 2, wherein each latch has an output and an input, with the latch output being coupled to the latch input to maintain the corresponding error signal during the plurality of test operations.

4. The memory self-test apparatus of claim 1, wherein the predetermined level of corresponding error signals is determined by an error correction capability of a selected error correction code.

5. The memory self-test apparatus of claim 1, wherein the predetermined level of corresponding error signals is at least two corresponding error signals.

6. The memory self-test apparatus of claim 1, wherein the test control circuit is further adapted to provide a pass signal when there is at most one corresponding error signal.

7. The memory self-test apparatus of claim 1, further comprising:
   a test data generator coupled to the comparator and coupled to the memory to provide the input test data.

8. The memory self-test apparatus of claim 7, wherein the test data generator is adapted to generate a plurality of test patterns corresponding to the plurality of test operations, each test pattern of the plurality of test patterns adapted to detect single-bit errors.

9. The memory self-test apparatus of claim 1, wherein the plurality of bit positions correspond to a data word having a plurality of data bits and a plurality of error correction bits.

10. The memory self-test apparatus of claim 1, wherein the plurality of bit positions correspond to a plurality of data words, wherein each data word of the plurality of data words has a plurality of data bits and a plurality of error correction bits.

11. The memory self-test apparatus of claim 1, wherein the plurality of bit positions correspond to a plurality of columns of the memory.

12. The memory self test apparatus of claim 1, wherein the test control circuit is implemented using combinatorial and conditional logic gates which provide the fail signal when there are at least two corresponding error signals.

13. The memory self test apparatus of claim 12, wherein the combinatorial and conditional logic gates are specified by a CASE statement which provides a pass signal when no corresponding error signal has occurred for all bit positions or when at most one corresponding error signal has occurred for all bit positions, and otherwise provides the fail signal.

14. The memory self-test apparatus of claim 1, wherein the plurality of memory read and write test operations utilize a plurality of single-bit error test patterns.

15. The memory self-test apparatus of claim 1, wherein the memory self test apparatus is integrated within a memory integrated circuit.

16. The memory self-test apparatus of claim 1, wherein the memory self-test apparatus is integrated with an embedded memory of an integrated circuit having a plurality of additional, non-memory functions.

17. The memory self-test apparatus of claim 1, wherein the memory self-test apparatus is embodied as a processor.

18. The memory self-test apparatus of claim 1, wherein the fail signal is a first state of a memory pass/fail indicator, and wherein a memory pass is a second state of the memory pass/fail indicator.

19. A memory system, comprising:
   a memory array adapted to store input test data and output stored test data during a plurality of memory read and write test operations;
   a comparator coupled to the memory array to receive the input test data and the stored test data, the comparator adapted to compare the input test data and the stored test data for a plurality of bit positions, and to provide a corresponding error signal when the stored test data is not identical to the input test data for each bit position of the plurality of bit positions;
   an integrator coupled to the comparator to receive the corresponding error signal, the integrator adapted to maintain the corresponding error signal for each bit position during the plurality of test operations; and
   a test control circuit coupled to the integrator, the test control circuit adapted to provide a fail signal when a predetermined level of corresponding error signals have been provided for the plurality of bit positions.

20. The memory system of claim 19, wherein the integrator comprises a plurality of latches, each latch of the plurality of latches corresponding to a bit position of the plurality of bit positions, wherein each latch has an output coupled to an input of the latch to maintain the corresponding error signal during the plurality of test operations.

21. The memory system of claim 19, wherein the predetermined level of corresponding error signals is determined by an error correction capability of a selected error correction code.

22. The memory system of claim 19, wherein the predetermined level of corresponding error signals is at least two corresponding error signals.

23. The memory system of claim 19, wherein the test control circuit is further adapted to provide a pass signal when there is at most one corresponding error signal, wherein the fail signal is a first state of a memory pass/fail indicator, and wherein a pass signal is a second state of the memory pass/fail indicator.

24. The memory system of claim 19, further comprising:
   a test data generator coupled to the comparator and to the memory array to provide the input test data, the test data generator adapted to generate a plurality of test patterns corresponding to the plurality of test operations, each test pattern of the plurality of test patterns adapted to detect single-bit errors.

25. The memory system of claim 19, wherein the plurality of bit positions correspond to one or more data words, each data word having a plurality of data bits and a plurality of error correction bits.

26. The memory system of claim 19, wherein the plurality of bit positions correspond to a plurality of columns of the memory array.

27. A method of testing a memory array, the memory array adapted to store input test data and output stored test data during a plurality of memory read and write test operations, the method comprising:
   comparing the input test data and the stored test data for a plurality of bit positions;
   providing a corresponding error signal when the stored test data is not identical to the input test data for each bit position of the plurality of bit positions;
   maintaining the corresponding error signal for each bit position during the plurality of test operations; and
   providing a fail signal when a predetermined level of corresponding error signals have been provided for the plurality of bit positions.

28. The method of testing a memory array of claim 27, wherein the predetermined level of corresponding error signals is determined by an error correction capability of a selected error correction code.

29. The method of testing a memory array of claim 27, wherein the predetermined level of corresponding error signals is at least two corresponding error signals.

30. The method of testing a memory array of claim 27, further comprising:
   providing a pass signal when there is at most one corresponding error signal.

31. The method of testing a memory array of claim 27, further comprising:
   generating a plurality of test patterns corresponding to the plurality of test operations, each test pattern of the plurality of test patterns adapted to detect single-bit errors.

32. The method of testing a memory array of claim 27, wherein the plurality of bit positions correspond to a one or more data words of a plurality of data words, wherein each data word of the plurality of data words has a plurality of data bits and a plurality of error correction bits.

33. The method of testing a memory array of claim 27, further comprising:
   providing the fail signal as a first state of a memory pass/fail indicator; and
   providing a pass signal as a second state of the memory pass/fail indicator.

34. A memory system, comprising:
   a memory array adapted to store input test data and output stored test data during a plurality of memory read and write test operations;
   a test data generator coupled to the memory array to provide the input test data, the test data generator adapted to generate a plurality of test patterns corresponding to the plurality of test operations, each test pattern of the plurality of test patterns adapted to detect single-bit errors;
   a comparator coupled to the test data generator to receive the input test data and coupled to the memory array to receive the stored test data, the comparator adapted to compare the input test data and the stored test data for a plurality of bit positions, and to provide a corresponding error signal when the stored test data is not identical to the input test data for each bit position of the plurality of bit positions, wherein the plurality of bit positions correspond to one or more data words, each data word having a plurality of data bits and a plurality of error correction bits;
   an integrator coupled to the comparator to receive the corresponding error signal, the integrator adapted to maintain the corresponding error signal for each bit position during the plurality of test operations; and
   a test control circuit coupled to the integrator, the test control circuit adapted to provide a fail signal when a predetermined level of corresponding error signals have been provided for the plurality of bit positions, the predetermined level of corresponding error signals corresponding to an error correction capability of a selected error correction code.

* * * * *